US012305827B2

(12) United States Patent
Shiraishi

(10) Patent No.: US 12,305,827 B2
(45) Date of Patent: May 20, 2025

(54) VEHICLE LIGHTING DEVICE, VEHICLE LAMP, AND METHOD FOR MANUFACTURING VEHICLE LIGHTING DEVICE

(71) Applicant: Toshiba Lighting & Technology Corporation, Kanagawa (JP)

(72) Inventor: Hiromitsu Shiraishi, Ehime-ken (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 0 days.

(21) Appl. No.: 18/595,372

(22) Filed: Mar. 4, 2024

(65) Prior Publication Data
US 2024/0384854 A1   Nov. 21, 2024

(30) Foreign Application Priority Data

May 18, 2023   (JP) ................... 2023-082079
Dec. 27, 2023  (JP) ................... 2023-220524

(51) Int. Cl.
*F21S 43/31*   (2018.01)
*F21S 41/19*   (2018.01)
*F21S 41/32*   (2018.01)
*F21S 41/37*   (2018.01)
*F21S 43/19*   (2018.01)
(Continued)

(52) U.S. Cl.
CPC ............. *F21S 43/31* (2018.01); *F21S 41/192* (2018.01); *F21S 41/32* (2018.01); *F21S 41/37* (2018.01); *F21S 43/195* (2018.01); *F21S 43/33* (2018.01); *F21S 45/47* (2018.01); *F21S 45/50* (2018.01); *H10H 20/856* (2025.01); *F21Y 2115/10* (2016.08); *H10H 20/857* (2025.01)

(58) Field of Classification Search
CPC . H01L 33/60; F21S 43/31; F21S 43/33; F21S 43/195; F21S 45/50; F21S 45/47; F21S 41/32; F21S 41/37; F21S 41/192; F21Y 2115/10; H10H 20/857; H10H 20/854; H10H 20/856
See application file for complete search history.

(56) References Cited

U.S. PATENT DOCUMENTS 8,889,459 B2 *  11/2014  Inobe ................ H01L 33/60
                                               438/27
9,410,673 B2    8/2016   Hino
(Continued)

FOREIGN PATENT DOCUMENTS

JP   2000101149 A  *  4/2000  ........... H01L 33/486
JP   2013247061       12/2013
(Continued)

*Primary Examiner* — Erin Kryukova
(74) *Attorney, Agent, or Firm* — JCIPRNET

(57) ABSTRACT

The disclosure provides a vehicle lighting device, a vehicle lamp, and a method for manufacturing a vehicle lighting device. The vehicle lighting device according to an embodiment includes: a socket; a substrate provided on one end side of the socket; a light-emitting element provided on the substrate; a frame part provided on the substrate and surrounding the light-emitting element; and a reflection part provided on the substrate and between a side surface of the light-emitting element and an inner wall of the frame part. An upper surface of the reflection part is a concave curved surface that protrudes toward the substrate side.

7 Claims, 6 Drawing Sheets

(51) Int. Cl.
*F21S 43/33* (2018.01)
*F21S 45/47* (2018.01)
*F21S 45/50* (2018.01)
*F21Y 115/10* (2016.01)
*H10H 20/856* (2025.01)
*H10H 20/857* (2025.01)

(56) References Cited

U.S. PATENT DOCUMENTS

| | | | |
|---|---|---|---|
| 11,189,765 B2 * | 11/2021 | Ozeki | H01L 33/62 |
| 2006/0102917 A1 | 5/2006 | Oyama et al. | |
| 2008/0054287 A1 * | 3/2008 | Oshio | H01L 33/60 |
| | | | 257/E33.059 |
| 2014/0293606 A1 * | 10/2014 | Hino | F21V 23/005 |
| | | | 362/296.04 |
| 2019/0393388 A1 * | 12/2019 | Sano | H01L 33/60 |
| 2020/0182432 A1 * | 6/2020 | Ueno | F21S 43/14 |
| 2022/0005992 A1 * | 1/2022 | Fujioka | H01L 25/167 |
| 2022/0102596 A1 * | 3/2022 | Matsuda | H01L 33/54 |

FOREIGN PATENT DOCUMENTS

| | | |
|---|---|---|
| JP | 2023065765 | 5/2023 |
| WO | 2004001862 | 12/2003 |

\* cited by examiner

VEHICLE LIGHTING DEVICE, VEHICLE LAMP, AND METHOD FOR MANUFACTURING VEHICLE LIGHTING DEVICE

CROSS-REFERENCE TO RELATED APPLICATION

This application claims the priority benefits of Japanese application no. 2023-082079, filed on May 18, 2023, and Japanese application no. 2023-220524, filed on Dec. 27, 2023. The entirety of the above-mentioned patent application is hereby incorporated by reference herein and made a part of this specification.

BACKGROUND

Technical Field

Embodiments of the disclosure relate to a vehicle lighting device, a vehicle lamp, and a method for manufacturing the vehicle lighting device.

Related Art

From the viewpoints of energy saving and longevity, vehicle lighting devices equipped with light-emitting elements such as light-emitting diodes are becoming more and more popular, instead of vehicle lighting devices equipped with lamps having filaments. A vehicle lighting device equipped with a light-emitting element includes a light-emitting module. The light-emitting module includes a substrate provided with a wiring pattern, a chip-shaped light-emitting element electrically connected to the wiring pattern, a frame part surrounding the chip-shaped light-emitting element, and a sealing part provided on an inner side of the frame part covering the chip-shaped light-emitting element.

Most of the light emitted from an upper surface of the chip-shaped light-emitting element is directly irradiated toward the front side of the vehicle lighting device. Light emitted from the upper surface of the chip-shaped light-emitting element and incident on an inner wall of the frame part is reflected on the inner wall of the frame part and irradiated toward the front side of the vehicle lighting device.

Here, light may also be emitted from a side surface of the chip-shaped light-emitting element. A part of the light emitted from the side surface of the light-emitting element is incident on a surface of the substrate located between the side surface of the light-emitting element and the inner wall of the frame part. Since a part of the light incident on the surface of the substrate is absorbed by the substrate, the efficiency of extracting light emitted from the light-emitting element can be reduced. In such a case, if a distance between the side surface of the light-emitting element and the inner wall of the frame part is shortened, an area of the substrate located between the side surface of the light-emitting element and the inner wall of the frame part can be reduced. If the exposed area of the substrate is reduced, the amount of light incident on the surface of the substrate can be reduced, and therefore the efficiency of extracting light emitted from the light-emitting elements can be improved.

However, a wiring wire that electrically connects the upper electrode of the light-emitting element and a wiring pattern provided on the surface of the substrate may be provided on the surface of the substrate located between the side surface of the light-emitting element and the inner wall of the frame part. Thus, it is difficult to improve the efficiency of extracting light emitted from the light-emitting element by shortening the distance between the side surface of the light-emitting element and the inner wall of the frame part.

Thus, it has been desired to develop a technique that can improve the efficiency of extracting light emitted from a light-emitting element.

CITATION LIST

Patent Literature

[Patent Literature 1] JP2013-247061

The disclosure provides a vehicle lighting device, a vehicle lamp, and a method for manufacturing the vehicle lighting device that can improve the efficiency of extracting light emitted from a light-emitting element.

SUMMARY

A vehicle lighting device according to an embodiment includes: a socket; a substrate provided on one end side of the socket; a light-emitting element provided on the substrate; a frame part provided on the substrate and surrounding the light-emitting element; a reflection part provided on the substrate and between a side surface of the light-emitting element and an inner wall of the frame part. An upper surface of the reflection part is a concave curved surface that protrudes toward the substrate.

DESCRIPTION OF THE EMBODIMENTS

Figure 1:
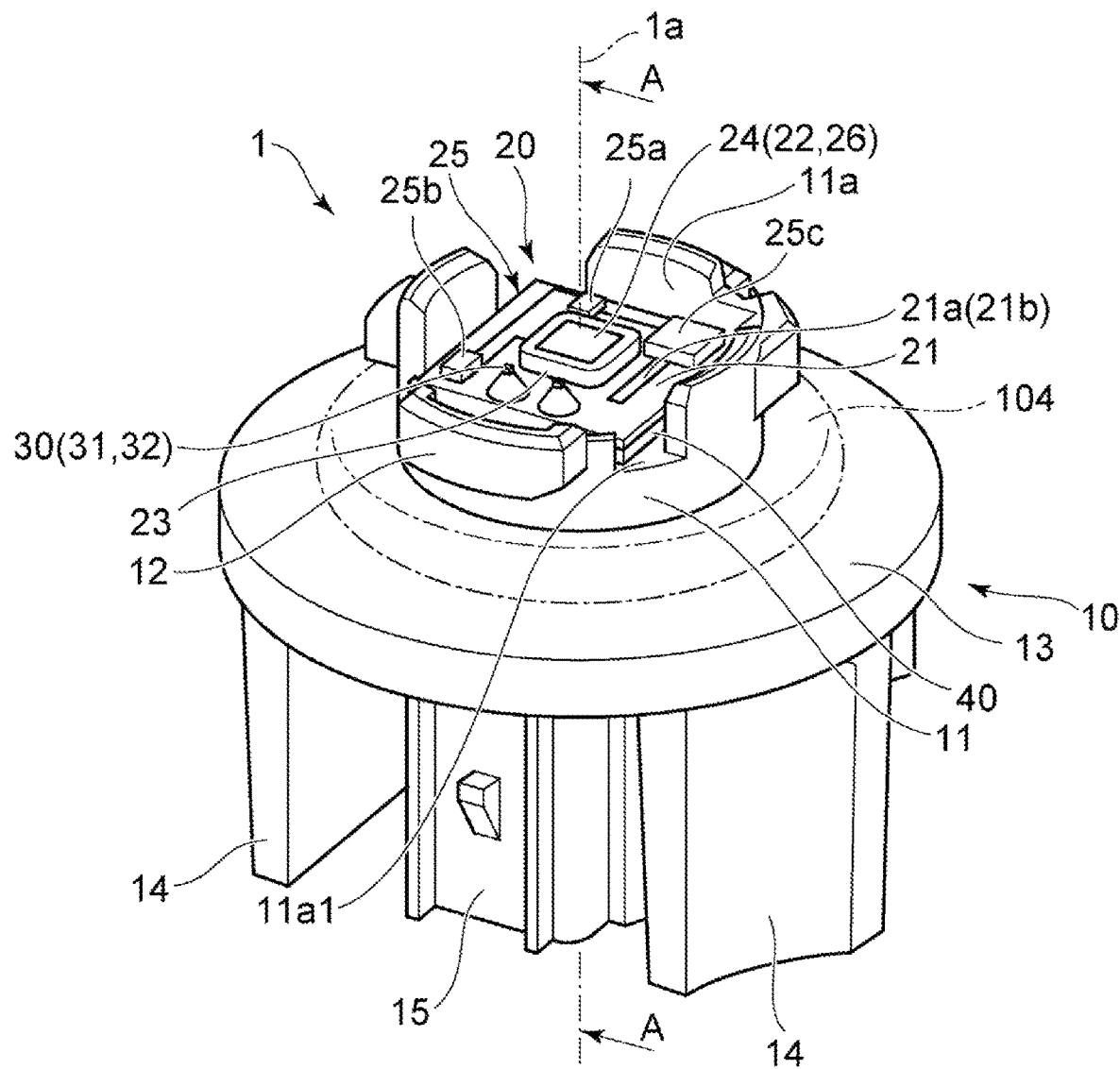
FIG. 1 is a schematic perspective view for showing a vehicle lighting device according to an embodiment.

According to embodiments of the disclosure, it is possible to provide a vehicle lighting device, a vehicle lamp, and a method for manufacturing the vehicle lighting device that can improve the efficiency of extracting light emitted from a light-emitting element.

Hereinafter, embodiments will be illustrated with reference to the drawings. In each drawing, similar components are denoted by the same reference numerals, and detailed explanations are omitted as appropriate.

(Vehicle Lighting Device)

A vehicle lighting device 1 according to the embodiment may be installed in, for example, an automobile or a railway vehicle. Examples of the vehicle lighting device 1 installed in an automobile include a front combination light (for example, an appropriate combination of Daytime Running Lamp (DRL), position lamp, turn signal lamp, etc.), or a rear combination light (for example, an appropriate combination of stop lamp, tail lamp, turn signal lamp, back lamp, fog lamp, etc.). However, the uses of the vehicle lighting device 1 are not limited thereto.

FIG. 1 is a schematic perspective view for showing the vehicle lighting device 1 according to the embodiment.

Figure 2:
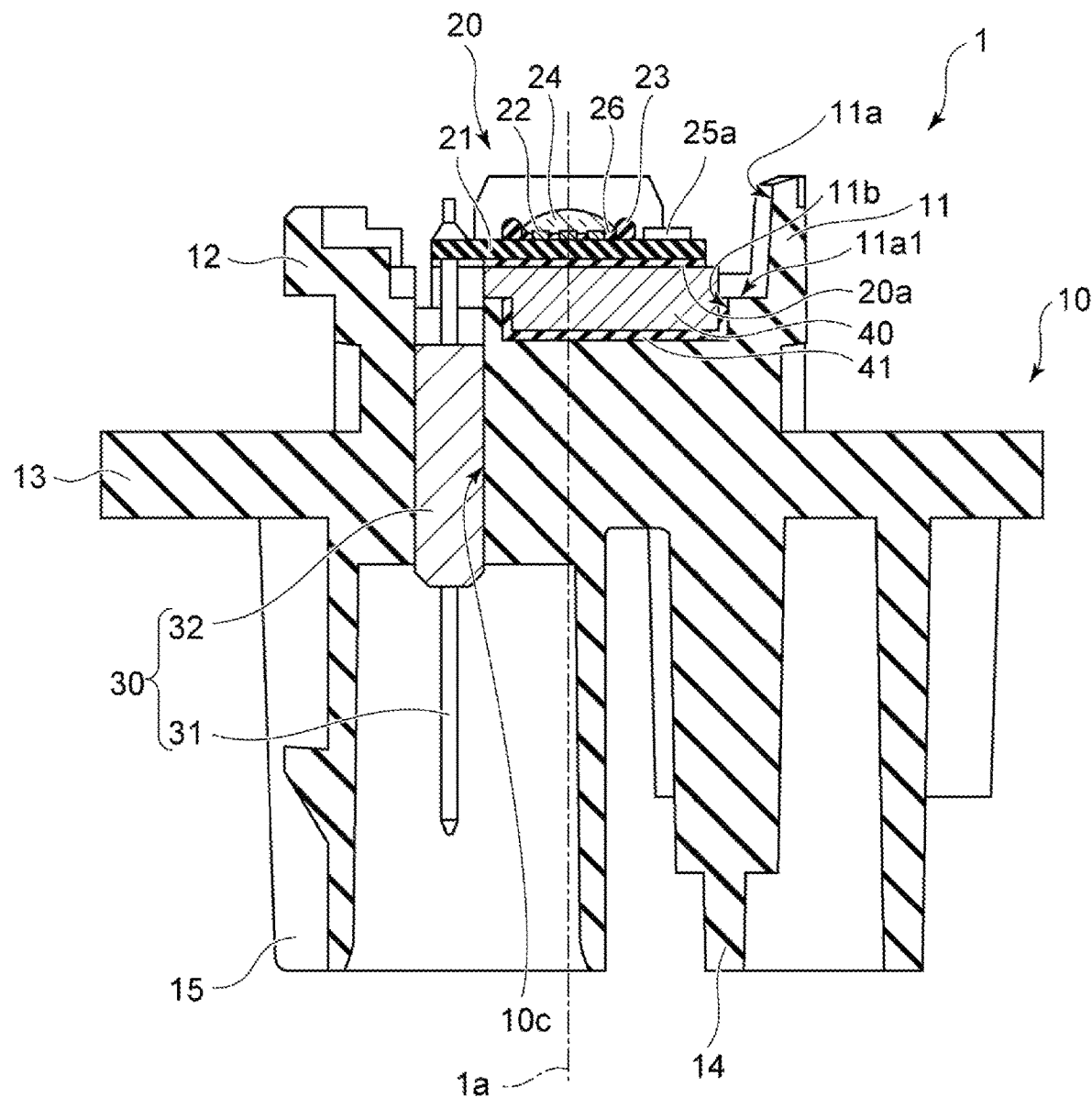
FIG. 2 is a cross-sectional view taken along line A-A of the vehicle lighting device in FIG. 1.

FIG. 2 is a cross-sectional view taken along line A-A of the vehicle lighting device 1 in FIG. 1.

Figure 3:
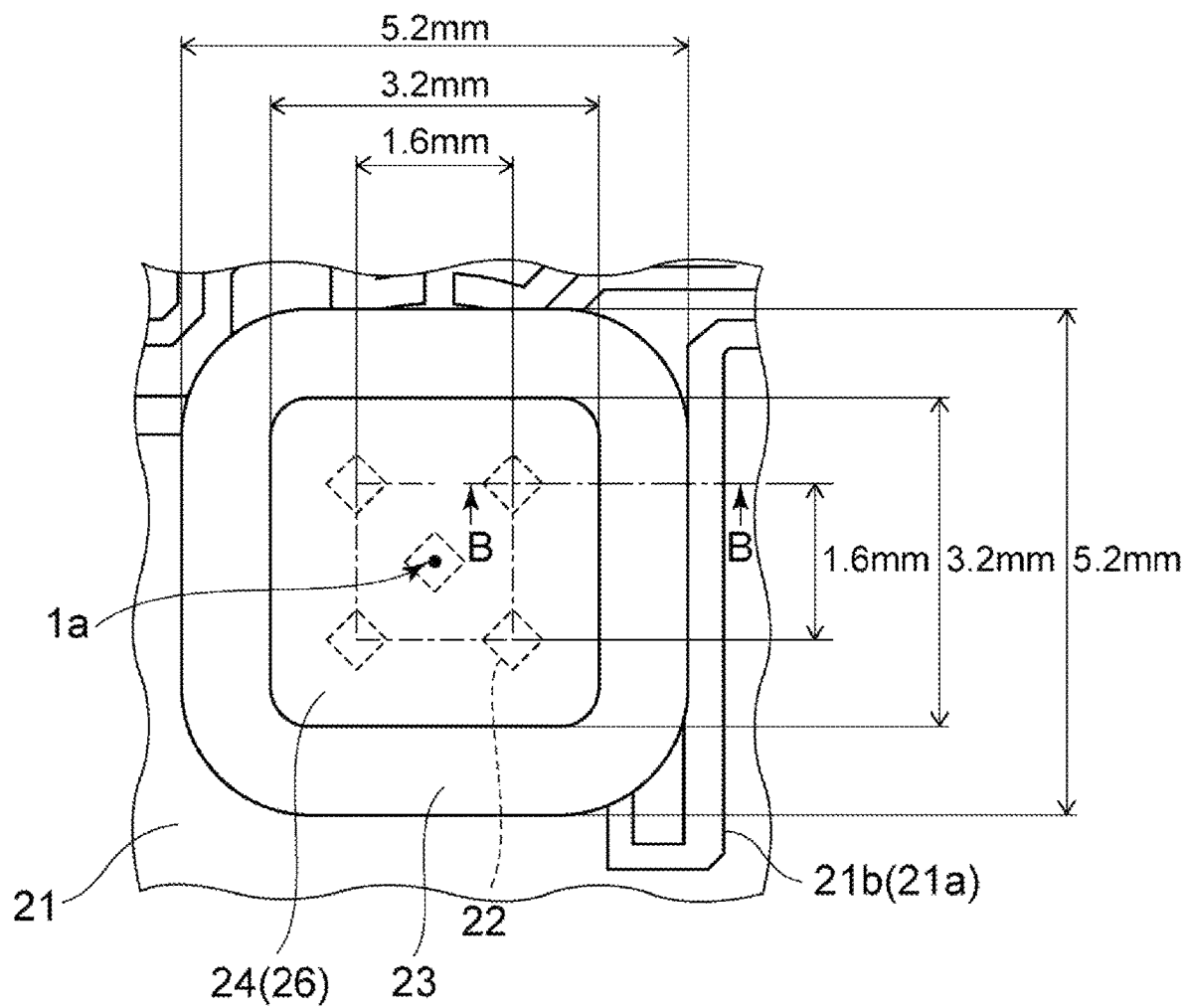
FIG. 3 is a schematic plan view of a region of a light-emitting module in which a frame part is provided.

FIG. 3 is a schematic plan view of a region of a light-emitting module 20 in which a frame part 23 is provided.

As shown in FIGS. 1 and 2, the vehicle lighting device 1 is provided with, for example, a socket 10, the light-emitting module 20, a power feed part 30, and a heat transfer part 40.

The socket 10 includes, for example, an attaching part 11, a bayonet 12, a flange 13, a heat radiation fin 14, and a connector holder 15.

The attaching part 11 is provided on a surface of the flange 13 on an opposite side to a side where the heat radiation fin 14 is provided. An outer shape of the attaching part 11 may be columnar. The outer shape of the attaching part 11 is, for example, cylindrical. The attaching part 11 has, for example, a recess 11a that opens at an end on an opposite side to the flange 13 side.

The bayonet 12 is provided, for example, on a side surface of the attaching part 11. The bayonet 12 protrudes toward an outer side of the vehicle lighting device 1. The bayonet 12 faces the flange 13. Multiple bayonet 12 may be provided. The bayonet 12 is used, for example, when mounting the vehicle lighting device 1 on a housing 101 of a vehicle lamp 100, which will be described later. The bayonet 12 may be used for twist locks.

The flange 13 has a plate shape. The flange 13 has, for example, a substantially disk shape. A side surface of the flange 13 is located further outward of the vehicle lighting device 1 than a side surface of the bayonet 12.

The heat radiation fin 14 is provided on an opposite side of the flange 13 from the attaching part 11 side. At least one heat radiation fin 14 may be provided. For example, as shown in FIG. 1, the socket 10 may be provided with multiple heat radiation fins 14. The multiple heat radiation fins 14 may be arranged side by side in a predetermined direction. The heat radiation fins 14 have, for example, a plate shape or a cylindrical shape.

The connector holder 15 is provided on the opposite side of the flange 13 from the attaching part 11 side. The connector holder 15 may be provided side by side with the heat radiation fins 14. The connector holder 15 has a cylindrical shape, and a connector 105 having a seal member 105a is inserted therein.

The socket 10 has a function of holding the light-emitting module 20 and the power feed part 30, and a function of transferring heat generated in the light-emitting module 20 to the outside. Thus, the socket 10 is preferably formed from a material having high thermal conductivity. The socket 10 may be made of metal such as aluminum or aluminum alloy, for example. The socket 10 containing metal may be formed by, for example, a die-casting method.

Further, in recent years, it has been desired that the socket 10 be able to efficiently dissipate heat generated in the light-emitting module 20 and be lightweight. Thus, the socket 10 may also be made of, for example, a high thermal conductive resin. The high thermal conductive resin includes, for example, a resin and a filler using an inorganic material. The high thermal conductive resin is, for example, a resin such as PET (polyethylene terephthalate) or nylon mixed with a filler using carbon, aluminum oxide, or the like.

If the socket 10 is one that includes a high thermal conductive resin and the attaching part 11, the bayonet 12, the flange 13, the heat radiation fin 14, and the connector holder 15 integrally formed, then heat generated in the light-emitting module 20 can be efficiently dissipated. Further, the weight of the socket 10 can be reduced. In such a case, the attaching part 11, the bayonet 12, the flange 13, the heat radiation fin 14, and the connector holder 15 may be integrally molded by an injection molding method or the like. Further, the socket 10 and the power feed part 30, or the socket 10, the power feed part 30, and the heat transfer part 40 may also be integrally molded by an insert molding method.

The light-emitting module 20 (substrate 21) is provided on one end side of the socket 10.

The light-emitting module 20 includes, for example, a substrate 21, a light-emitting element 22, a frame part 23, a sealing part 24, a circuit element 25, and a reflection part 26.

As shown in FIG. 2, the substrate 21 may be adhered onto the heat transfer part 40, for example. In such a case, the adhesive is preferably an adhesive having high thermal conductivity. For example, the adhesive may be an adhesive mixed with a filler made of an electrically conductive material or an inorganic material. As the adhesive cures, an adhesive layer 20a is formed between the light-emitting module 20 (substrate 21) and the heat transfer part 40.

As shown in FIGS. 1 and 2, the substrate 21 has a plate shape. A planar shape of the substrate 21 (the shape when viewed from the direction along a central axis 1a of the vehicle lighting device 1) is, for example, a substantially rectangle. The substrate 21 may be made of, for example, an inorganic material such as ceramics (e.g. aluminum oxide or aluminum nitride), or an organic material such as paper phenol or glass epoxy. Further, the substrate 21 may be a metal core substrate in which a surface of a metal plate is coated with an insulating material. In a case where the light-emitting element 22 generates a large amount of heat, it is preferable to form the substrate 21 by a material having high thermal conductivity from the viewpoint of heat dissipation. Examples of materials having high thermal conductivity include ceramics such as aluminum oxide and aluminum nitride, high thermal conductive resins, and metal core substrates. Further, the substrate 21 may have a single layer structure or a multilayer structure.

Further, as shown in FIGS. 1 and 3, a wiring pattern 21a is provided on the surface of the substrate 21. The wiring pattern 21a is formed of, for example, a material containing silver as a main component, a material containing copper as a main component, or the like.

Further, a covering part 21b is provided to cover the wiring pattern 21a, a film resistor to be described later, or the like. The covering part 21b includes, for example, a glass material.

As shown in FIGS. 2 and 3, the light-emitting element 22 is provided on the substrate 21 (on a surface of the substrate 21 opposite to the socket 10 side). The light-emitting element 22 is electrically connected to the wiring pattern 21a. At least one light-emitting element 22 may be provided.

For example, as shown in FIG. 3, five light-emitting elements 22 may be provided. In such a case, a center of one light-emitting element 22 may overlap with the central axis 1a of the vehicle lighting device 1, and centers of the four light-emitting elements 22 may be located at positions rotationally symmetric around the central axis 1a. For example, as shown in FIG. 3, the center of each of the four light-emitting elements 22 may be located at corners of a square having a side length of 1.6 mm. A planar shape of the light-emitting element 22 shown in FIG. 3 (the shape when viewed from the direction along the central axis 1a of the vehicle lighting device 1) is a square with one side of 0.48 mm.

The number, arrangement, and a planar shape of the light-emitting elements 22 may be changed as appropriate depending on the required total luminous flux, light distribution characteristics, brightness distribution, and the like. Further, in a case where multiple light-emitting elements 22 are provided, the multiple light-emitting elements 22 may be connected in series.

The light-emitting element 22 may be, for example, a light-emitting diode, an organic light-emitting diode, a laser diode, or the like.

The light-emitting element 22 may be a chip-shaped light-emitting element. If the light-emitting element 22 is a chip-shaped light-emitting element, the light-emitting module 20 can be downsized and thus the vehicle lighting device 1 can be downsized.

The chip-shaped light-emitting element 22 may be mounted on the wiring pattern 21a by COB (Chip On Board). The chip-shaped light-emitting element 22 may be any of an upper electrode type light-emitting element, an upper and lower electrode type light-emitting element, and a flip chip type light-emitting element. In a case where the light-emitting element 22 is an upper electrode type light-emitting element or an upper and lower electrode type light-emitting element, a wiring wire 22c for electrically connecting the upper electrode of the light-emitting element 22 and the wiring pattern 21a (For example, see FIG. 4 to be described below) is provided.

As shown in FIGS. 1 to 3, the frame part 23 is provided on the substrate 21. The frame part 23 is adhered to the substrate 21. The frame part 23 has a frame shape and surrounds the light-emitting element 22. A contour of the frame part 23 when viewed from the direction along the central axis 1a of the vehicle lighting device 1 may be, for example, a rectangle as shown in FIG. 3. In such a case, a contour of the corner of the rectangle may be a curved line such as a semicircle, for example. Further, as shown in FIG. 3, a center of the frame part 23 may be made to overlap the central axis 1a of the vehicle lighting device 1. In such a case, a length between inner walls of the frame part 23 may be, for example, about 3.2 mm. A length between outer walls of the frame part 23 may be, for example, about 5.2 mm.

The shape and dimensions of the contour of the frame part 23 when viewed from the direction along the central axis 1a of the vehicle lighting device 1 may be appropriately changed depending on the number and arrangement of light-emitting elements 22, required light distribution characteristics, brightness distribution, etc. For example, the shape of the contour of the frame part 23 may be a circle, an ellipse, or the like.

The frame part 23 is formed from a resin, for example. The resin may be a thermoplastic resin such as PBT (polybutylene terephthalate), PC (polycarbonate), PET, nylon, PP (polypropylene), PE (polyethylene), PS (polystyrene), or a silicone resin.

The frame part 23 has the function of defining the formation range of the sealing part 24 and the function of a reflector. Thus, the frame part 23 may be formed from a material that has a high reflectance to the light emitted from the light-emitting element 22. The material of the frame part 23 may be, for example, a white resin or a resin containing light-scattering particles (for example, titanium oxide particles). The material of the frame part 23 may be, for example, a mixture of silicone resin and titanium oxide particles. In such a case, the content of titanium oxide particles may be, for example, about 20 wt %. The frame part 23 may be formed, for example, by an injection molding method or by cutting. Further, the frame part 23 may also be formed by applying resin in a frame shape using a supply device such as a dispenser.

Details regarding the frame part 23 will be described later.

The sealing part 24 is provided on an inner side of the frame part 23. The sealing part 24 is provided so as to cover a region surrounded by the frame part 23. The sealing part 24 is provided so as to cover the light-emitting element 22. The sealing part 24 includes a resin having translucency. The sealing part 24 is formed, for example, by filling the inner side of the frame part 23 with resin. Filling with resin may be performed using a supply device such as a dispenser, for example. The resin to be filled is, for example, silicone resin.

Further, the sealing part 24 may include a phosphor. The phosphor may be, for example, a YAG-based phosphor (yttrium-aluminum-garnet-based phosphor). However, the type of phosphor may be changed as appropriate such that a predetermined emission color may be obtained depending on the use of the vehicle lighting device 1 and the like.

The circuit element 25 may be a passive element or an active element configured to configure a light-emitting circuit having the light-emitting element 22. The circuit element 25 is provided, for example, around the frame part 23 and electrically connected to the wiring pattern 21a. The circuit element 25 is electrically connected to the light-emitting element 22 via the wiring pattern 21a. Moreover, the circuit element 25 may be provided, for example, in a lighting circuit provided outside the vehicle lighting device 1. In this way, the configuration of the light-emitting module 20 can be simplified, and therefore the manufacturing cost of the vehicle lighting device 1 can be reduced. When the circuit element 25 is provided in the light-emitting module 20, it becomes easy to protect the light-emitting module 20 or to make the light-emitting module 20 multifunctional.

The circuit element 25 may be, for example, a resistor 25a, a protection element 25b, and a control element 25c.

The type of the circuit element 25 is not to those shown in the examples, and may be changed as appropriate depending on the configuration of the light-emitting circuit having the light-emitting element 22. For example, the circuit element 25 may be a capacitor, a positive characteristic thermistor, a negative characteristic thermistor, an inductor, a surge absorber, a varistor, a transistor, an integrated circuit, an arithmetic element, etc. in addition to those described above.

The resistor 25a is provided on the substrate 21. The resistor 25a is electrically connected to the wiring pattern 21a. The resistor 25a may be, for example, a surface-mounted resistor, a resistor with lead wires (metal oxide film resistor), a film resistor formed by a screen printing method or the like. Moreover, the resistor 25a shown in FIG. 1 is a surface-mounted resistor.

Here, since there are deviations in the forward voltage characteristics of the light-emitting element 22, when an applied voltage between an anode terminal and a ground terminal is constant, there will be deviations in a brightness (luminous flux, luminance, luminosity, illuminance) of the light emitted from the light-emitting element 22. Thus, to ensure that the brightness of the light emitted from the light-emitting element 22 falls within a predetermined range, the current flowing through the light-emitting element 22 is set to fall within a predetermined range by means of the resistor 25a connected in series with the light-emitting element 22. In such a case, by changing the resistance value of the resistor 25a, the value of the current flowing through the light-emitting element 22 is made to be within a predetermined range.

In a case where the resistor 25a is a surface-mounted resistor, a resistor with a lead wire, or the like, the resistor 25a having an appropriate resistance value is selected according to the forward voltage characteristics of the light-emitting element 22. In a case where the resistor 25a is a film resistor, the resistance value may be increased by removing a part of the resistor 25a. For example, by irradiating a film resistor with a laser beam, a part of the film resistor may be easily removed. Moreover, the number, arrangement, size, etc. of the resistors 25a are not limited to those illustrated, and may be changed as appropriate depending on the number, specifications, etc. of the light-emitting elements 22.

The protection element 25b is provided on the substrate 21. The protection element 25b is electrically connected to the wiring pattern 21a. The protection element 25b is provided, for example, to prevent a reverse voltage from being applied to the light-emitting element 22 and to prevent pulse noise from being applied to the light-emitting element 22 from the opposite direction. The protection element 25b is, for example, a diode. The protection element 25b shown in FIG. 1 is a surface-mounted diode.

The control element 25c is provided on the substrate 21. The control element 25c is electrically connected to the wiring pattern 21a. The control element 25c is provided, for example, to switch the voltage applied to the light-emitting element 22. The control element 25c may be, for example, a transistor or an integrated circuit. Moreover, the control element 25c shown in FIG. 1 is a surface-mounted integrated circuit.

Here, the light-emitting element 22 mainly emits light from an upper surface (the surface on an opposite side to the substrate 21 side), but light is also emitted from a side surface (the surface intersecting the upper surface) of the light-emitting element 22. For example, about 20% of the total luminous flux is emitted from a side surface of the light-emitting element 22. A part of the light emitted from the side surface of the light-emitting element 22 is incident on the surface of the substrate 21 located between the side surface of the light-emitting element 22 and the inner wall of the frame part 23, the wiring pattern 21a, and the covering part 21b. When light is incident on the surface of the substrate 21 or the like, a part of the incident light is absorbed by the surface of the substrate 21, and the efficiency of extracting light emitted from the light-emitting element 22 is reduced.

Thus, the reflection part 26 is provided on the substrate 21 and between the side surface of the light-emitting element 22 and the inner wall of the frame part 23. For example, the reflection part 26 is provided on the surface of the substrate 21 on the inner side of the frame part 23, the wiring pattern 21a, and the covering part 21b. For example, the reflection part 26 may be formed from a material that has a high reflectance for light emitted from the light-emitting element 22. For example, the material of the reflection part 26 may be a white resin, a resin containing light-scattering particles (for example, titanium oxide particles), or the like. The material of the reflection part 26 may be, for example, a mixture of silicone resin and titanium oxide particles. In such a case, the content of titanium oxide particles may be, for example, about 20 wt %. The reflection part 26 may contain the same material as the frame part 23, or may contain a different material. The reflection part 26 may be formed, for example, by applying resin using a supply device such as a dispenser.

Details regarding the reflection part 26 will be described later.

Further, optical elements and the like may be provided as necessary. The optical element is, for example, a convex lens, a concave lens, a light guide, or the like. The optical element may be provided on the sealing part 24, for example. The optical element may be joined to at least one of the sealing part 24 and the frame part 23, for example. When an optical element is provided, for example, it becomes easy to obtain desired light distribution characteristics.

As shown in FIG. 2, the power feed part 30 includes, for example, multiple power feed terminals 31 and a holding part 32.

The multiple power feed terminals 31 may be made into a rod-shaped body. For example, the multiple power feed terminals 31 are arranged side by side in a predetermined direction. One end of the multiple power feed terminals 31 protrudes from a bottom surface 11a1 of the recess 11a. One end of the multiple power feed terminals 31 is soldered to the wiring pattern 21a provided on the substrate 21. The other end of the multiple power feed terminals 31 is exposed inside a hole of the connector holder 15. The connector 105 is fitted into the multiple power feed terminals 31 exposed inside the hole of the connector holder 15. The multiple power feed terminals 31 are made of metal such as copper alloy, for example. Moreover, the shape, arrangement, material, etc. of the multiple power feed terminals 31 are not limited to those illustrated, and may be changed as appropriate.

As described above, the socket 10 is preferably formed by a material having high thermal conductivity. However, materials having high thermal conductivity may be electrically conductive. For example, a high thermal conductive resin containing a carbon filler and a metal such as an aluminum alloy are electrically conductive. Thus, the holding part 32 is provided to insulate between the multiple power feed terminals 31 and the electrically conductive socket 10. Further, the holding part 32 also has a function of holding the multiple power feed terminals 31. The holding part 32 is made of, for example, an insulating resin. The holding part 32 may be made of resin such as PET or nylon, for example.

The holding part 32 with the multiple power feed terminals 31 may be provided inside a hole 10c extending inside the socket 10. The holding part 32 with the multiple power feed terminals 31 may be press-fitted into the hole 10c, adhered to an inner wall of the hole 10c, or integrally molded with the socket 10 by an insert molding method.

Moreover, in a case where the socket 10 is formed from a high thermal conductive resin having insulating properties (for example, a high thermal conductive resin containing a filler using aluminum oxide), the holding part 32 may be omitted. In such a case, the socket 10 holds the multiple power feed terminals 31.

The heat transfer part 40 is provided between the socket 10 and the light-emitting module 20 (substrate 21). As shown in FIG. 2, the heat transfer part 40 may be adhered, for example, to an inside of a recess 11b that opens on the bottom surface 11a1 of the recess 11a. As the adhesive cures, an adhesive layer 41 is formed between the heat transfer part 40 and an inner wall of the recess 11b. Moreover, the heat transfer part 40 may be adhered to the bottom surface 11a1 of the recess 11a, adhered onto a convex pedestal provided on the bottom surface 11a1 of the recess 11a, or integrally molded with the socket 10 by an insert molding method. Moreover, the heat transfer part 40 may also be attached to the inside of the recess 11b via thermal conductive grease (heat radiation grease).

The heat transfer part 40 is provided to facilitate the transfer of heat generated in the light-emitting module 20 to the socket 10. Thus, the heat transfer part 40 is formed from a material having high thermal conductivity. For example, the heat transfer part 40 may be formed from metal such as aluminum, aluminum alloy, copper, copper alloy, or the like.

Moreover, in a case where the socket 10 is made of metal, the heat transfer part 40 may be omitted. In such a case, the light-emitting module 20 (substrate 21) may be adhered to the bottom surface 11a1 of the recess 11a, or adhered onto a convex pedestal provided on the bottom surface 11a1 of the recess 11a.

The adhesive for adhering the heat transfer part 40 is preferably an adhesive having high thermal conductivity. For example, the adhesive may be the same as the adhesive that adheres the light-emitting module 20 (substrate 21) and the heat transfer part 40.

Next, the frame part 23 and the reflection part 26 will be further illustrated.

Figure 4:
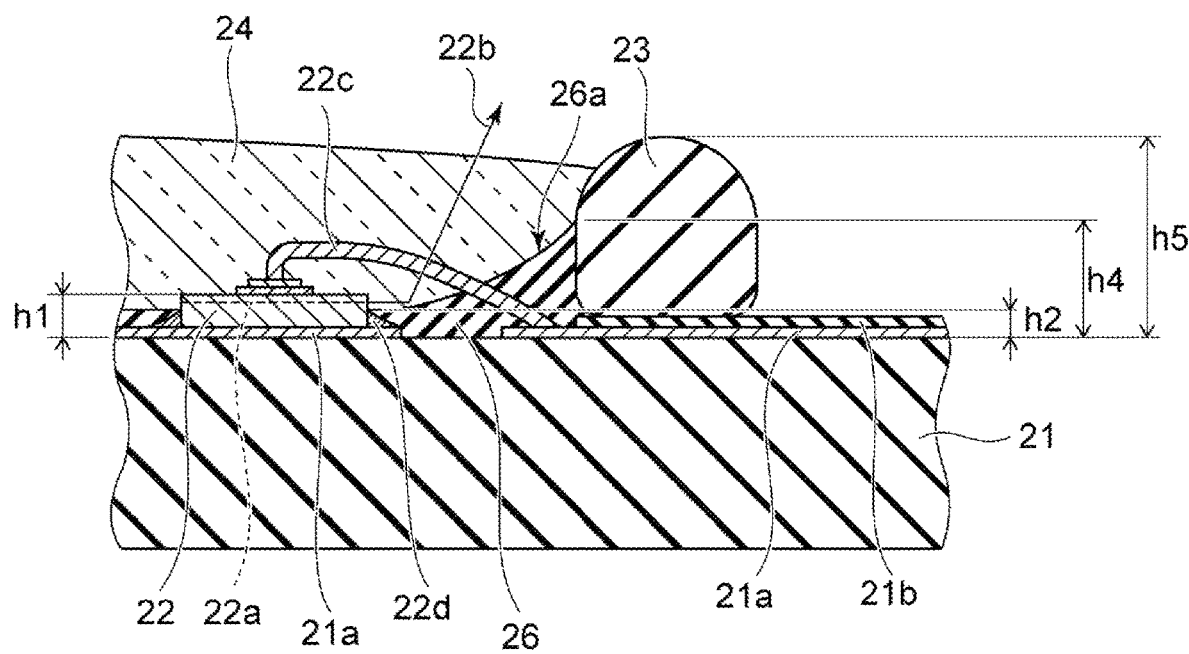
FIG. 4 is a cross-sectional view taken along line B-B of the frame part and the reflection part in FIG. 3.

FIG. 4 is a cross-sectional view taken along line B-B of the frame part 23 and the reflection part 26 in FIG. 3.

Figure 5:
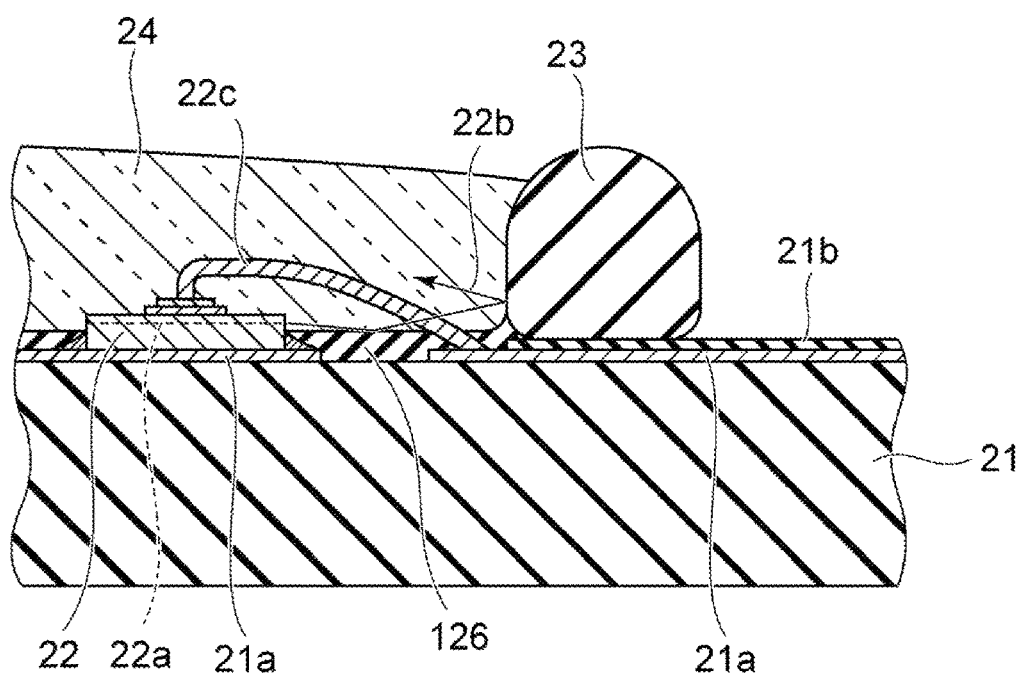
FIG. 5 is a schematic cross-sectional view of a reflection part according to a comparative example.

FIG. 5 is a schematic cross-sectional view of a reflection part 126 according to a comparative example. Moreover, FIG. 5 is a view corresponding to the line B-B cross section in FIG. 3.

First, the reflection part 126 according to a comparative example will be illustrated.

As shown in FIG. 5, the reflection part 126 is provided on the substrate 21 and between the side surface of the light-emitting element 22 and the inner wall of the frame part 23. The reflection part 126 is film-like, and its upper surface (the surface on the opposite side to the substrate 21 side) is substantially parallel to the surface of the substrate 21. As described above, the light-emitting element 22 mainly emits light from the upper surface, but light 22b is also emitted from the side surface of the light-emitting element 22. A part of the light 22b emitted from the side surface of the light-emitting element 22 is reflected by an upper surface of the reflection part 126. In such a case, since the upper surface of the reflection part 126 is substantially parallel to the surface of the substrate 21, an incident angle of the light 22b on the upper surface of the reflection part 126 becomes larger. Thus, as shown in FIG. 5, an incident angle of the light 22b on the inner wall of the frame part 23 becomes smaller, making it difficult for the light 22b to be emitted to the outside of the frame part 23. In other words, the light extraction efficiency is reduced.

In such a case, if the position on the side surface of the light-emitting element 22 where a light-emitting layer 22a is provided is covered with the reflection part 126, the light 22b will not be incident on the upper surface of the reflection part 126. However, if the light 22b emitted from the side surface of the light-emitting element 22 is blocked by the reflection part 126, the light 22b will be repeatedly reflected inside the light-emitting element 22. Thus, the light 22b is attenuated inside the light-emitting element 22. Thus, the light extraction efficiency is reduced.

Moreover, if the inner wall of the frame part 23 is an inclined surface, the incident angle of the light 22b on the inner wall of the frame part 23 can be increased. When the incident angle of the light 22b on the inner wall of the frame part 23 becomes larger, the light 22b is easily emitted to the outside of the frame part 23. However, as shown in FIG. 5, the wiring wire 22c electrically connect the upper electrode of the light-emitting element 22 and the wiring pattern 21a may be provided near the inner wall of the frame part 23. In such a case, the position of the inner wall of the frame part 23 is more on an outer side than the joining position of the wiring wire 22c and the wiring pattern 21a. Thus, outer dimensions of the frame part 23 become larger, or a volume (outer dimensions) of the sealing part 24 becomes larger. When the outer dimensions of the frame part 23 become larger, it becomes difficult to downsize the light-emitting module 20 and, by extension, downsize of the vehicle lighting device 1 becomes difficult. Further, as the volume (outer dimensions) of the sealing part 24 becomes larger, thermal stress generated by turning on and off (heating and cooling) the light-emitting element 22 becomes larger. When the thermal stress becomes larger, the light-emitting element 22 and the wiring wire 22c may come off from the wiring pattern 21a, or the wiring wire 22c may break.

Next, the reflection part 26 according to the embodiment will be illustrated.

As shown in FIG. 4, the reflection part 26 is provided on the substrate 21 and between the side surface of the light-emitting element 22 and the inner wall of the frame part 23. For example, the reflection part 26 is provided on the surface of the substrate 21 on the inner side of the frame part 23, the wiring pattern 21a, and the covering part 21b.

Here, although the upper surface of the reflection part 126 is substantially parallel to the surface of the substrate 21, the upper surface (the surface on an opposite side from the substrate 21) 26a of the reflection part 26 is a concave curved surface that protrudes toward the substrate 21 side.

As shown in FIG. 4, a part of the light 22b emitted from the side surface of the light-emitting element 22 is reflected by an upper surface 26a of the reflection part 26. In such a case, since the upper surface 26a of the reflection part 26 is a concave curved surface that protrudes toward the substrate 21 side, an incident angle of the light 22b on the upper surface 26a of the reflection part 26 becomes smaller. Thus, as shown in FIG. 4, the light 22b is easily emitted to the outside of the frame part 23. That is, the efficiency of extracting light emitted from the light-emitting element 22 can be improved.

Further, if the reflection part 26 having a concave curved surface (upper surface 26a) is provided between the side surface of the light-emitting element 22 and the inner wall of the frame part 23, the volume of the sealing part 24 can be reduced. When the volume of the sealing part 24 becomes smaller, the thermal stress generated by turning on and turning off (heating and cooling) the light-emitting element 22 becomes smaller. When the thermal stress becomes smaller, it is possible to prevent the light-emitting element 22 and the wiring wire 22c from coming off the wiring pattern 21a or the wiring wire 22c from breaking.

Here, in the direction along the central axis 1a of the vehicle lighting device 1, if a distance between the surface of the substrate 21 and the upper surface of the light-emitting element 22 is h1 (mm), a distance between the surface of the substrate 21 and a position of an upper end of the reflection part 26 on the side surface of the light-emitting element 22 is h2 (mm), a distance between the surface of the substrate 21 and a position of the upper end of the reflection part 26 on the inner wall of the frame part 23 is h4 (mm), and a distance between the surface of the substrate 21 and a top of the frame part 23 (the end on the opposite side to the substrate 21 side) is h5 (mm), then "h2 (mm)<h1 (mm)<h4

(mm)<h5 (mm)" is preferable. In this way, it becomes easy to make the upper surface 26a of the reflection part 26 into a concave curved surface that protrudes toward the substrate 21 side. In such a case, a radius of curvature of the upper surface 26a of the reflection part 26 is preferably 0.2 mm or more and 1.2 mm or less. The reflection part 26 may be formed by supplying softened resin to the surface of the substrate 21 using a supply device such as a dispenser. As shown in FIG. 4, a joint part between the wiring wire 22c and the wiring pattern 21a may be provided near the inner wall of the frame part 23. In such a case, the reflection part 26 may be provided on the joint part between the wiring wire 22c and the wiring pattern 21a. Since the reflection part 26 is formed by supplying softened resin, even if the reflection part 26 is provided on the joint part between the wiring wire 22c and the wiring pattern 21a, it is possible to prevent the wiring wire 22c from coming off from the wiring pattern 21a or the wiring wire 22c from breaking.

In a case where the reflection part 26 is provided on the joint part between the wiring wire 22c and the wiring pattern 21a, it is preferable to make a linear expansion coefficient of the material of the reflection part 26 smaller than a linear expansion coefficient of the material of the sealing part 24. In this way, when the temperature of the light-emitting module 20 rises, a force acting on the wiring wire 22c becomes smaller as compared with the case where the sealing part 24 is provided on the joint part of the wiring wire 22c and the wiring pattern 21a. Thus, when the temperature of the light-emitting module 20 rises, it is difficult for the wiring wire 22c to come off from the wiring pattern 21a, and it is difficult for the wiring wire 22c to break.

Moreover, if a difference between the linear expansion coefficient of the material of the reflection part 26 and the linear expansion coefficient of the material of the sealing part 24 becomes smaller, the thermal stress generated as the temperature rises becomes smaller. When the thermal stress becomes smaller, the force that pulls the wiring wire 22c in a shearing direction becomes smaller, when the temperature of the light-emitting module 20 rises, it is possible to further suppress the wiring wire 22c from coming off the wiring pattern 21a or the wiring wire 22c from breaking.

According to the knowledge obtained by the Inventor, the linear expansion coefficient of the material of the reflection part 26 is preferably $80 \times 10^{-6}$/K or more and $210 \times 10^{-6}$/K or less. The linear expansion coefficient of the material of the sealing part 24 is preferably $90 \times 10^{-6}$/K or more and $310 \times 10^{-6}$/K or less.

In this way, when the temperature of the light-emitting module 20 rises, it is possible to effectively prevent the wiring wire 22c from coming off the wiring pattern 21a or the wiring wire 22c from breaking.

Further, in a case where the reflection part 26 is provided on the joint part between the wiring wire 22c and the wiring pattern 21a, it is preferable to make a Young's modulus of the material of the reflection part 26 smaller than a Young's modulus of the material of the sealing part 24. In this way, when the temperature of the light-emitting module 20 rises, the force acting on the wiring wire 22c becomes smaller as compared with the case where the sealing part 24 is provided on the joint part of the wiring wire 22c and the wiring pattern 21a. Thus, when the temperature of the light-emitting module 20 rises, it is difficult for the wiring wire 22c to come off from the wiring pattern 21a, and it is difficult for the wiring wire 22c to break.

According to the knowledge obtained by the Inventor, the Young's modulus of the material of the reflection part 26 is preferably 3 MPa or more and 20 MPa or less. The Young's modulus of the material of the sealing part 24 is preferably 5 MPa or more and 50 MPa or less.

In this way, when the temperature of the light-emitting module 20 rises, it is possible to effectively prevent the wiring wire 22c from coming off the wiring pattern 21a or the wiring wire 22c from breaking.

The radius of curvature of the upper surface 26a of the reflection part 26 may be controlled by adjusting a viscosity or the like of the softened resin. In such a case, the radius of curvature of the upper surface 26a of the reflection part 26 is preferably 0.2 mm or more and 1.2 mm or less.

Here, if "$0.2 \times h1$ (mm)$\leq h2$ (mm)", then a joining material 22d that joins the light-emitting element 22 and the wiring pattern 21a may be covered by the reflection part 26. Thus, it is possible to prevent a part of the light 22b emitted from the side surface of the light-emitting element 22 from being incident on the joining material 22d, which reduces the efficiency of extracting the light emitted from the light-emitting element 22.

Further, if "$h2$ (mm)$\leq 0.97 \times h1$ (mm)", then it is possible to suppress the position where the light-emitting layer 22a is provided on the side surface of the light-emitting element 22 from being covered by the reflection part 26. Thus, it is possible to suppress the light 22b from being confined inside the light-emitting element 22. As a result, it is possible to suppress a reduction in light extraction efficiency.

That is, it is preferable that "$0.2 \times h1$ (mm)$\leq h2$ (mm) $\leq 0.97 \times h1$ (mm)". For example, h1 (mm) may be about 0.125 mm, and h2 (mm) may be about 0.11 mm.

Further, if "$3 \times h1$ (mm)$\leq h4$ (mm)$\leq 0.8 \times h5$ (mm)", then the radius of curvature of the upper surface 26a of the reflection part 26 may be easily made to be 0.2 mm or more and 1.2 mm or less.

For example, h5 (mm) may be about 0.8 mm to 1 mm, and h4 (mm) may be about 0.5 mm (about half of h5 (mm)).

Figure 6:
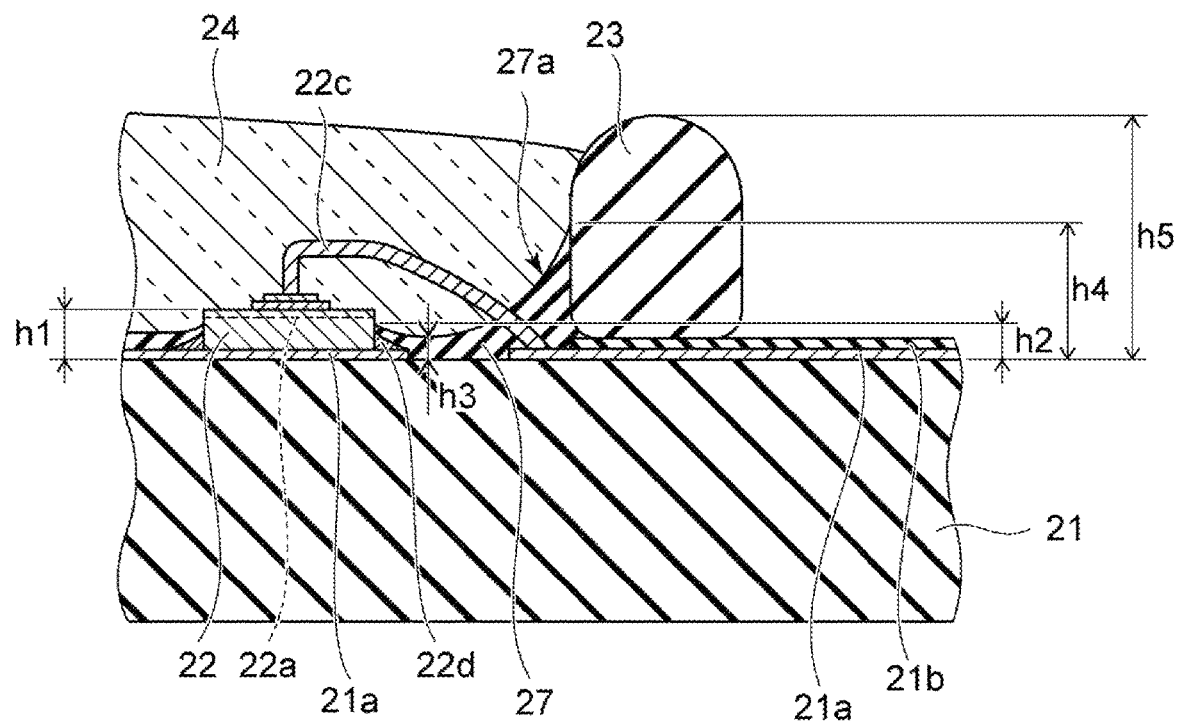
FIG. 6 is a schematic cross-sectional view of a reflection part according to another embodiment.

FIG. 6 is a schematic cross-sectional view of a reflection part 27 according to another embodiment. Moreover, FIG. 6 is a view corresponding to the line B-B cross section in FIG. 3.

As shown in FIG. 6, the reflection part 27 is provided on the substrate 21 and between the side surface of the light-emitting element 22 and the inner wall of the frame part 23. For example, the reflection part 27 is provided on the surface of the substrate 21 on the inner side of the frame part 23, the wiring pattern 21a, and the covering part 21b.

Similar to the reflection part 26, an upper surface 27a (the surface on the opposite side to the substrate 21 side) of the reflection part 27 is a concave curved surface that protrudes toward the substrate 21 side. Thus, similarly to the reflection part 26 as described above, an incident angle of the light 22b on the upper surface 27a of the reflection part 27 becomes smaller. As a result, the light 22b is easily emitted to the outside of the frame part 23, such that the efficiency of extracting the light emitted from the light-emitting element 22 can be improved.

Further, similar to the reflection part 26 as described above, since the volume of the sealing part 24 may be reduced, the thermal stress generated by turning on and off (heating and cooling) the light-emitting element 22 becomes smaller. When the thermal stress becomes smaller, it is possible to prevent the light-emitting element 22 and the wiring wire 22c from coming off the wiring pattern 21a or the wiring wire 22c from breaking.

Here, as described above, the reflection part 27 may be formed by supplying softened resin to the surface of the substrate 21 using a supply device such as a dispenser. As described above, if the softened resin is supplied to the surface of the substrate 21, even if the joint part between the wiring wire 22c and the wiring pattern 21a is provided near the inner wall of the frame part 23, it is possible to prevent the wiring wire 22c from coming off the wiring pattern 21a or the wiring wire 22c from breaking.

If the softened resin covers the side surface of the light-emitting element 22 at a position where the light-emitting layer 22a is provided or creeps up onto the upper surface of the light-emitting element 22, there is a risk that the light extraction efficiency will be reduced.

Thus, in a direction perpendicular to the central axis 1a of the vehicle lighting device 1, a vertex (the point where a distance between the upper surface 27a of the reflection part 27 and the surface of the substrate 21 is shortest) of the upper surface 27a of the reflection part 27 is arranged between side surface of the light-emitting element 22 and inner wall of the frame part 23.

In such a case, in the direction along the central axis 1a of the vehicle lighting device 1, if a distance between the surface of the substrate 21 and the vertex of the upper surface 27a of the reflection part 27 is h3 (mm), it may be that "h3 (mm)<h2 (mm)<h1 (mm)<h4 (mm)<h5 (mm)". In this way, it becomes easy to make the upper surface 27a of the reflection part 27 a curved surface that protrudes toward the substrate 21 side. Further, it is possible to prevent the softened resin from covering the side surface of the light-emitting element 22 at the position where the light-emitting layer 22a is provided or from creeping up onto the upper surface of the light-emitting element 22 when forming the reflection part 27.

In such a case, if "0.01×h1 (mm)≤h3 (mm)", then the wiring pattern 21a may be covered by the reflection part 27. Thus, it is possible to prevent a part of the light 22b emitted from the side surface of the light-emitting element 22 from being incident on the wiring pattern 21a, which reduces the efficiency of extracting the light emitted from the light-emitting element 22.

Moreover, if "h3 (mm)≤0.9×h1 (mm)", then a radius of curvature of the upper surface 27a may be increased, such that the light 22b may be easily emitted to the outside of the frame part 23. That is, the efficiency of extracting light emitted from the light-emitting element 22 can be improved.

That is, it is preferable that "0.01×h1 (mm)≤h3 (mm) ≤0.9×h1 (mm)". For example, h3 (mm) may be about 0.06 mm (about half of h1 (mm)).

Moreover, the dimensions and dimensional ratios of h1 (mm), h2 (mm), h4 (mm), and h5 (mm) in the reflection part 27 may be the same as those exemplified in the reflection part 26.

Here, a reflectance of a surface of the substrate 21 to the light emitted from the light-emitting element 22 may be 90% or more. For example, in a case where the substrate 21 is made of white ceramics (for example, aluminum oxide), the reflectance of the surface of the substrate 21 to the light emitted from the light-emitting element 22 is 90% or more. In such a case, even if a region on the surface of the substrate 21 where the wiring pattern 21a and the covering part 21b are not provided is partially exposed from the reflection part 27, it is possible to suppress a reduction in light extraction efficiency.

Thus, in a case where the reflectance of the surface of the substrate 21 to the light emitted from the light-emitting element 22 is 90% or more, h3 (mm) may be set to 0 mm. As described above, since the value of h3 (mm) is small, "0.01×h1 (mm)≤h3 (mm)≤0.9×h1 (mm)" may be difficult. In such a case, if "0 mm≤h3 (mm)≤0.9×h1 (mm)" may be set, the formation of the reflection part 27 becomes easier.

Figure 7:
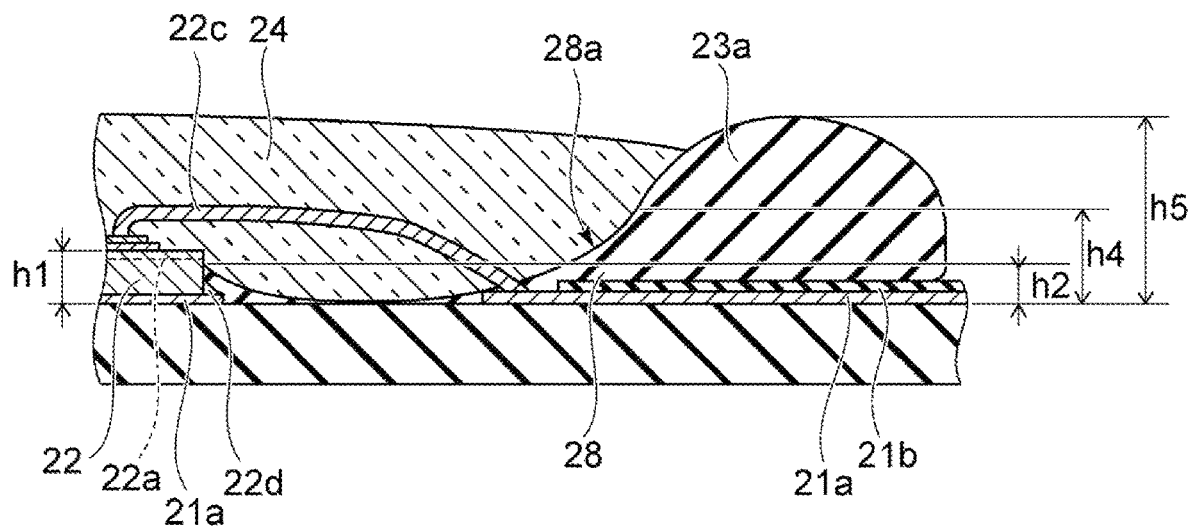
FIG. 7 is a schematic cross-sectional view of a reflection part according to another embodiment.

FIG. 7 is a schematic cross-sectional view of a reflection part 28 according to another embodiment. Moreover, FIG. 7 is a view corresponding to the line B-B cross section in FIG. 3.

As shown in FIG. 7, the reflection part 28 is provided on the substrate 21 and between the side surface of the light-emitting element 22 and an inner wall of a frame part 23a. For example, the reflection part 28 is provided on the surface of the substrate 21 on an inner side of the frame part 23a, the wiring pattern 21a, and the covering part 21b.

The frame part 23 shown in FIGS. 4 and 6 may be formed by an injection molding injection molding method, by cutting, or the like. The formed frame part 23 is adhered to the surface of the substrate 21. The reflection parts 26 and 27 are formed by supplying softened resin to the inner side of the frame part 23.

On the other hand, the frame part 23a is formed by supplying softened resin in a frame shape to the surface of the substrate 21 and curing the resin supplied in a frame shape. Further, the reflection part 28 is formed by supplying softened resin to a predetermined region of the surface of the substrate 21 and curing the supplied resin. The softened resin may be supplied using a supply device such as a dispenser.

In this way, the frame part 23a and the reflection part 28 may be integrally formed by the same resin and the same supply device. That is, the reflection part 28 includes the same material as the frame part 23a, and may be formed integrally with the frame part 23a. For example, the frame part 23a and the reflection part 28 may be formed by changing the supply position and supply amount of the softened resin. Thus, it is possible to simplify the manufacturing process, and thereby reducing manufacturing costs and shorten the manufacturing period.

As in the case of the reflection parts 26 and 27 described above, an upper surface 28a of the reflection part 28 (the surface on the opposite side to the substrate 21 side) is a concave curved surface that protrudes toward the substrate 21 side. Thus, similarly to the reflection parts 26 and 27, the efficiency of extracting light emitted from the light-emitting element 22 can be improved.

Moreover, the frame part 23a and the reflection part 28 may be formed integrally, and the frame part 23a or the reflection part 28 may be formed at the joining position of the wiring wire 22c and the wiring pattern 21a. If the frame part 23a or the reflection part 28 are formed at the joining position of the wiring wire 22c and the wiring pattern 21a, the outer dimensions of the frame part 23a may be reduced, thus the light-emitting module 20 can be downsized, and, by extension, the vehicle lighting device 1 can be downsized. Further, since the volume (outer dimensions) of the sealing part 24 may be reduced, the thermal stress generated by turning on and turning off (heating and cooling) the light-emitting element 22 can be reduced. Thus, it is possible to prevent the light-emitting element 22 and the wiring wire 22c from coming off the wiring pattern 21a or the wiring wire 22c from breaking.

Further, as shown in FIG. 7, softened resin may be supplied onto the covering part 21b to form the frame part 23a or the reflection part 28. In such a case, a joining strength between the formed frame part 23a and the reflection part 28 and the substrate 21 side becomes larger than when the softened resin is supplied onto the surface of the substrate 21 or onto the wiring pattern 21a. Thus, a layer containing a glass material may be provided under at least one of the frame part 23a and the reflection part 28. For example, the covering part 21b may be provided on the surface of the substrate 21 in a region where the frame part 23a and the reflection part 28 are provided. In this way, the joining strength between the frame part 23a and the reflection part 28 and the substrate 21 side can be increased.

Here, softened resin may be supplied in a frame shape to a region of the surface of the substrate 21 where the frame part 23a is to be formed, and the softened resin may be supplied to an inner side of the resin supplied in a frame shape. That is, the resin for forming the frame part 23a may be supplied before the resin for forming the reflection part 28 is supplied. However, in this way, the resin is supplied to a narrow region between the resin supplied in a frame shape and the light-emitting element 22. In order to supply softened resin from a nozzle such as a dispenser to the narrow region, it is necessary to precisely control a position of the nozzle. Thus, there is a possibility that workability will be reduced or yield will be reduced.

Thus, it is preferable to supply the softened resin to the region of the surface of the substrate 21 where the reflection part 28 is to be formed, and further supply the softened resin in a frame shape to an outer side of the supplied resin. That is, it is preferable that the resin for forming the reflection part 28 is supplied before the resin for forming the frame part 23a is supplied. In such a case, the resin supplied earlier is pushed out toward the inner side by the resin supplied in a frame shape, thereby forming the reflection part 28 having a concave curved surface that protrudes toward the substrate 21 side.

That is, in a method for manufacturing a vehicle lighting device according to the embodiment, softened resin is supplied to the region where the reflection part 28 is formed on the surface of the substrate 21, and the softened resin is further supplied in a frame shape to the outer side of the supplied resin.

In this way, a positional accuracy of the nozzle may be relaxed, such that workability and yield can be improved.

Moreover, a vertex of the upper surface 28a of the reflection part 28 (the point where a distance between the upper surface 28a of the reflection part 28 and the surface of the substrate 21 is shortest) may be made the same as the vertex of the upper surface 27a of the reflection part 27 described above. Further, the dimensions and dimensional ratios of h1 (mm), h2 (mm), h3 (mm), h4 (mm), and h5 (mm) may be the same as those exemplified for the reflection parts 26 and 27. Moreover, the reflection part 28 shown in FIG. 7 is a case where h3 (mm) is 0 mm. That is, this is the case where a region of the surface of the substrate 21 where the wiring pattern 21a and the covering part 21b are not provided is partially exposed from the reflection part 28.

(Vehicle Lamp)

In one embodiment of the disclosure, the vehicle lamp 100 including the vehicle lighting device 1 may be provided. The descriptions related to the vehicle lighting device 1, and the modified examples of the vehicle lighting device 1 (for example, the reflection part 27, the reflection part 28, the frame part 23a, or those in which a person having ordinary knowledge in the art appropriately adds, deletes or modifies the design of components and which have the features of the disclosure) may all be applied to the vehicle lamp 100.

Hereinafter, a case where the vehicle lamp 100 is a front combination light provided in an automobile will be described as an example. However, the vehicle lamp 100 is not limited to a front combination light provided in an automobile. The vehicle lamp 100 may be any vehicle lamp installed in an automobile, a railway vehicle, or the like.

Figure 8:
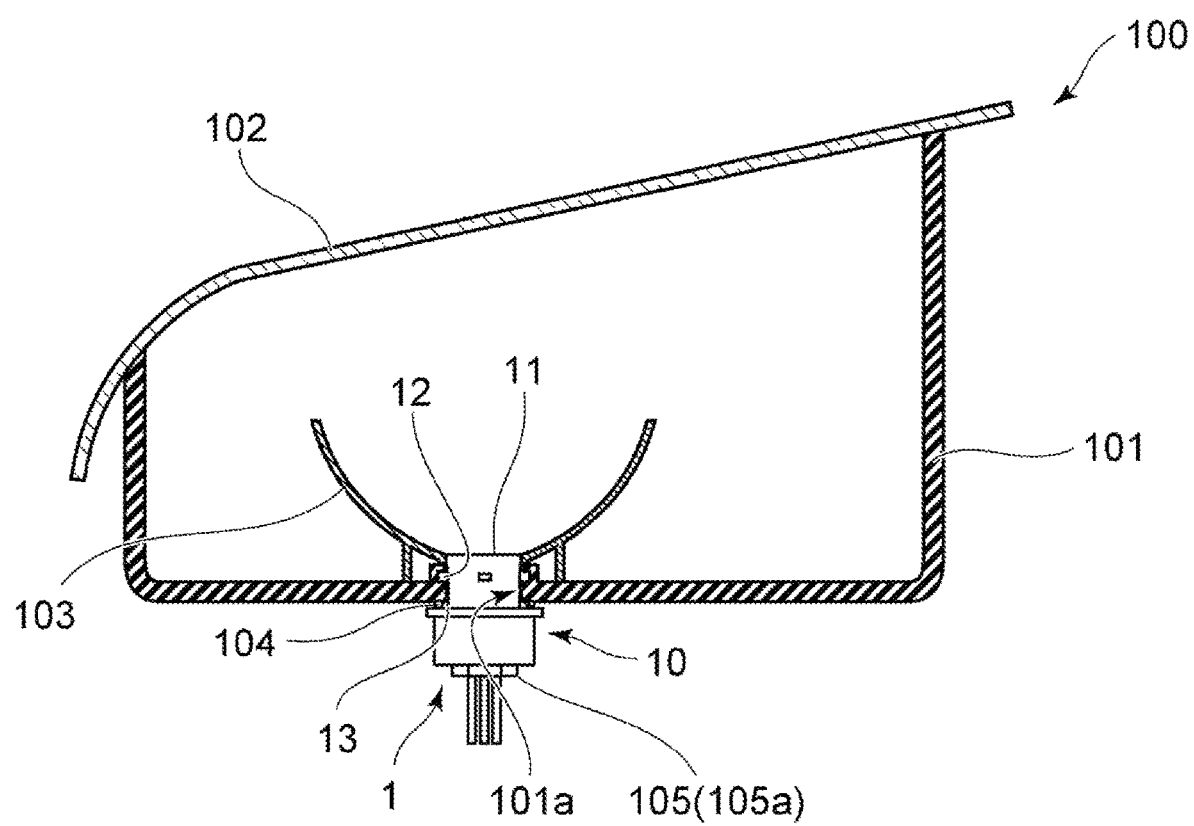
FIG. 8 is a schematic partial cross-sectional view for showing a vehicle lamp.

FIG. 8 is a schematic partial cross-sectional view for showing the vehicle lamp 100.

As shown in FIG. 8, the vehicle lamp 100 includes, for example, the vehicle lighting device 1, the housing 101, a cover 102, an optical element 103, a seal member 104, and the connector 105.

The vehicle lighting device 1 is attached to the housing 101. The housing 101 holds the attaching part 11. The housing 101 has a box shape with one end open. The housing 101 is made of, for example, resin that does not transmit light. A bottom surface of the housing 101 is provided with a mounting hole 101a into which a part of the attaching part 11 provided with the bayonet 12 is inserted. A recess into which the bayonet 12 provided on the attaching part 11 is inserted is provided at a periphery of the mounting hole 101a. Moreover, although the case in which the mounting hole 101a is directly provided in the housing 101 has been illustrated, a mounting member having the mounting hole 101a may be provided in the housing 101.

When attaching the vehicle lighting device 1 to the vehicle lamp 100, the part of the attaching part 11 provided with the bayonet 12 is inserted into the mounting hole 101a, and the vehicle lighting device 1 is rotated. Then, for example, the bayonet 12 is held in a fitting part provided at the periphery of the mounting hole 101a. This type of attachment method is called a twist lock.

The cover 102 is provided to close the opening of the housing 101. The cover 102 is made of translucent resin or the like. The cover 102 may also have a function such as a lens.

Light emitted from the vehicle lighting device 1 is incident on the optical element 103. The optical element 103 reflects, diffuses, guides, condenses, and forms a predetermined light distribution pattern for the light emitted from the vehicle lighting device 1. For example, the optical element 103 shown in FIG. 8 is a reflector. In such a case, the optical element 103 reflects the light emitted from the vehicle lighting device 1 to form a predetermined light distribution pattern.

The seal member 104 is provided between the flange 13 and the housing 101. The seal member 104 has an annular shape and is made of an elastic material such as rubber or silicone resin.

When the vehicle lighting device 1 is attached to the vehicle lamp 100, the seal member 104 is sandwiched between the flange 13 and the housing 101. Thus, the seal member 104 may seal an internal space of the housing 101. Further, the bayonet 12 is pressed against the housing 101 due to an elastic force of the seal member 104. Thus, it is possible to suppress the vehicle lighting device 1 from detaching from the housing 101.

The connector 105 is fitted to the ends of the multiple power feed terminals 31 exposed to the inside of the connector holder 15. A lighting circuit or the like is electrically connected to the connector 105. Thus, by fitting the connector 105 to the ends of the multiple power feed terminals 31, a lighting circuit or the like may be electrically connected to the light-emitting element 22.

Further, the connector 105 is provided with the seal member 105a. When the connector 105 having the seal member 105a is inserted into the connector holder 15, the inside of the connector holder 15 is sealed such that it is watertight.

Although several embodiments of the disclosure have been illustrated above, these embodiments are presented as examples and are not intended to limit the scope of the disclosure. These novel embodiments may be implemented in various other forms, and various omissions, substitutions, modifications, etc. may be made without departing from the gist of the disclosure. These embodiments and their modifications are included within the scope and gist of the disclosure, as well as within the scope of the disclosure described in the claims and its equivalents. Further, each of the embodiments described above may be implemented in combination with each other.

Supplementary notes regarding the embodiments described above will be shown below.

(Supplementary Note 1)

A vehicle lighting device, including:

a socket;

a substrate provided on one end side of the socket;

a light-emitting element provided on the substrate;

a frame part provided on the substrate and surrounding the light-emitting element; and a reflection part provided on the substrate and between a side surface of the light-emitting element and an inner wall of the frame part, in which an upper surface of the reflection part is a concave curved surface that protrudes toward the substrate.

(Supplementary Note 2)

The vehicle lighting device according to Supplementary note 1, in which the reflection part includes a same material as the frame part and is formed integrally with the frame part.

(Supplementary Note 3)

The vehicle lighting device according to Supplementary note 1 or 2, further including:

a wiring wire that electrically connects an upper electrode of the light-emitting element and a wiring pattern provided on the substrate, in which at least one of the frame part and the reflection part is provided on a joint part between the wiring wire and the wiring pattern.

(Supplementary Note 4)

The vehicle lighting device according to Supplementary note 3, being at least one of:

a linear expansion coefficient of the material of the reflection part is smaller than a linear expansion coefficient of a material of a sealing part, and a Young's modulus of the material of the reflection part is smaller than a Young's modulus of the material of the sealing part.

(Supplementary Note 5)

The vehicle lighting device according to any one of Supplementary notes 1 to 4, in which in a direction along a central axis of the vehicle lighting device, in a case where a distance between a surface of the substrate and an upper surface of the light-emitting element is h1 (mm); a distance between the surface of the substrate and a position of an upper end of the reflection part on the side surface of the light-emitting element is h2 (mm); a distance between the surface of the substrate and a position of the upper end of the reflection part on the inner wall of the frame part is h4 (mm); and a distance between the surface of the substrate and a top of the frame part is h5 (mm), a following formula is satisfied:

$h2$ (mm)<$h1$ (mm)<$h4$ (mm)<$h5$ (mm).

(Supplementary Note 6)

The vehicle lighting device according to Supplementary note 5, in which in the direction along the central axis of the vehicle lighting device, in a case where a distance between the surface of the substrate and a vertex of the upper surface of the reflection part is h3 (mm), a following formula is further satisfied:

$h3$ (mm)<$h2$ (mm).

(Supplementary Note 7)

A vehicle lamp, including:

a vehicle lighting device according to any one of Supplementary notes 1 to 6, and a housing to which the vehicle lighting device is attached.

(Supplementary Note 8)

A method for manufacturing a vehicle lighting device according to any one of Supplementary Notes 1 to 6, including:

supplying a softened resin to a region of a surface of a substrate where a reflection part is to be formed, and further supplying the softened resin in a frame shape to an outer side of the supplied resin.

What is claimed is:

1. A vehicle lighting device, comprising:

a socket;

a substrate provided on one end side of the socket;

a light-emitting element provided on the substrate;

a frame part provided on the substrate and surrounding the light-emitting element;

a sealing part provided on an inner side of the frame part so as to cover the light-emitting elements;

a reflection part provided on the substrate and between a side surface of the light-emitting element and an inner wall of the frame part; and a wiring wire that electrically connects an upper electrode of the light-emitting element and a wiring pattern provided on the substrate, wherein an upper surface of the reflection part is a concave curved surface that protrudes toward the substrate, and wherein the reflection part is provided on a joint part between the wiring wire and the wiring pattern, and wherein at least one of:

a linear expansion coefficient of the material of the reflection part is smaller than a linear expansion coefficient of a material of the sealing part, and a Young's modulus of the material of the reflection part is smaller than a Young's modulus of the material of the sealing part.

2. The vehicle lighting device according to claim 1, wherein the reflection part includes a same material as the frame part and is formed integrally with the frame part.

3. The vehicle lighting device according to claim 2, wherein in a direction along a central axis of the vehicle lighting device, in a case where a distance between a surface of the substrate and an upper surface of the light-emitting element is h1 (mm); a distance between the surface of the substrate and a position of an upper end of the reflection part on the side surface of the light-emitting element is h2 (mm); a distance between the surface of the substrate and a position of the upper end of the reflection part on the inner wall of the frame part is h4 (mm); and a distance between the surface of the substrate and a top of the frame part is h5 (mm), a following formula is satisfied:

$h2$ (mm)<$h1$ (mm)<$h4$ (mm)<$h5$ (mm).

4. A vehicle lighting device according to claim 3,
wherein in the direction along the central axis of the vehicle lighting device, in a case where a distance between the surface of the substrate and a vertex of the upper surface of the reflection part is h3 (mm), a following formula is further satisfied:

$h3$ (mm)<$h2$ (mm).

5. The vehicle lighting device according to claim 1, wherein in a direction along a central axis of the vehicle lighting device, in a case where a distance between a surface of the substrate and an upper surface of the light-emitting element is h1 (mm); a distance between the surface of the substrate and a position of an upper end of the reflection part on the side surface of the light-emitting element is h2 (mm); a distance between the surface of the substrate and a position of the upper end of the reflection part on the inner wall of the frame part is h4 (mm); and a distance between the surface of the substrate and a top of the frame part is h5 (mm), a following formula is satisfied:

$h2$ (mm)<$h1$ (mm)<$h4$ (mm)<$h5$ (mm).

6. A vehicle lighting device according to claim 5,
wherein in the direction along the central axis of the vehicle lighting device, in a case where a distance between the surface of the substrate and a vertex of the upper surface of the reflection part is h3 (mm), a following formula is further satisfied:

$h3$ (mm)<$h2$ (mm).

7. A vehicle lamp, comprising:
a vehicle lighting device according to claim 1, and
a housing to which the vehicle lighting device is attached.

* * * * *